United States Patent [19]
Kim

[11] 3,986,142
[45] Oct. 12, 1976

[54] AVALANCHE SEMICONDUCTOR AMPLIFIER

[75] Inventor: Chung Kyu Kim, Lexington, Mass.

[73] Assignee: Raytheon Company, Lexington, Mass.

[22] Filed: Mar. 24, 1975

[21] Appl. No.: 561,446

Related U.S. Application Data

[63] Continuation of Ser. No. 447,620, March 4, 1974, abandoned, which is a continuation of Ser. No. 291,483, Sept. 22, 1972, abandoned, which is a continuation of Ser. No. 133,642, April 13, 1971, abandoned.

[52] U.S. Cl. ............................ 331/107 R; 357/13; 357/15; 357/55; 357/56
[51] Int. Cl.² ........................................ H01L 29/90
[58] Field of Search ................. 357/13, 56, 15, 55; 331/107 R

[56] References Cited
UNITED STATES PATENTS

| | | | |
|---|---|---|---|
| 3,483,441 | 12/1969 | Hofflinger | 331/107 R |
| 3,516,017 | 6/1970 | Kaneko | 357/3 |
| 3,689,993 | 9/1972 | Tolar | 357/15 |

OTHER PUBLICATIONS

Kim et al., "GaAs Schottky Barrier...," *Solid State Electron,* Jan. 1970, pp. 53–56.
Lindley et al., "GaAs Schottky Barrier...," *Applied Physics Letters,* Mar. 15, 1969, pp. 197–199.

*Primary Examiner*—William D. Larkins
*Attorney, Agent, or Firm*—John R. Inge; Joseph D. Pannone; Milton D. Bartlett

[57] ABSTRACT

A microwave semiconductor amplifier or oscillator system in which a semiconductor device has an avalanching region at a junction and a heat sink having a higher thermal conductivity than said avalanching region in close thermal contact with the said junction. The avalanching region has a width substantially less than 10 times the thickness of said avalanching region but a length substantially greater than said width. The heat sink is made substantially wider than that of the avalanching region so that heat generated in the avalanching region during operation of the system and moving into the heat sink will have a substantial component thereof moving parallel to the junction, thereby decreasing the thermal resistance between the heat source and the heat sink and hence permitting an increased power output from the system. The thermal resistance between the avalanching region and the heat sink is further reduced by the use of a Schottky type junction in which a thin layer of platinum is deposited on gallium arsenide N type semiconductor material and a gold heat sink is deposited on the platinum layer.

7 Claims, 5 Drawing Figures

AVALANCHE SEMICONDUCTOR AMPLIFIER

The Invention herein described was made in the course of or under a contract or subcontract thereunder with the Department of Defense.

CROSS REFERENCE TO RELATED APPLICATIONS

This is a continuation of application Ser. No. 447,620 filed Mar. 4, 1974 (now abandoned), which is a continuation of application Ser. No. 291,483 filed Sept. 22, 1972 (now abandoned), which is a continuation of application Ser. No. 133,642 filed Apr. 13, 1971 (now abandoned).

BACKGROUND OF THE INVENTION

Microwave systems using bulk semiconductor properties and/or junction characteristics such as avalanche diodes, bulk effect diodes or Gunn diodes can be designed to work at frequencies generally above those economically feasible or practical for transistors. However, such devices generate substantial amounts of heat in the semiconductor body and the average power output is limited by the rate at which such heat can be removed.

SUMMARY OF THE INVENTION

This invention provides for increasing the power output and/or efficiency of microwave semiconductor devices by lowering the thermal resistance between the source of heat in the semiconductor region of a semiconductor junction device and a heat sink having a higher thermal conductivity than said semiconductor region. The term "semiconductor junction device" as used herein is intended to include all devices in wich an energy level gap exists between two adjacent regions in which an energy level gap exists between two adjacent regions of the device. Since the power output of such devices is limited by the maximum power input which can be applied to the device without overheating, increasing the rate at which heat will flow out of the heat producing semiconductor region increases the maximum average power input and, therefore, increases the maximum average power output.

In addition, such a power increase in some semiconductor junction devices, such as some avalanche devices operating in the TRAPATT oscillation mode, allows an increase in efficiency since the current densities necessary for maximum efficiency, which can exceed 40%, having required intermittent or pulsed operation and by increasing the heat dissipation, the pulse length can be made longer or, if desired, such TRAPATT mode devices can be made to operate efficiently as substantially continuous wave devices.

More specifically, the invention provides for the use of substantially extended junctions in which one transverse dimension, which may be referred to as the width, of the active or avalanching region where the major portion of the heat is generated, is made substantially less than ten times the thickness of the said region. The junction adjacent to the avalanching region is positioned in intimate thermal contact with a heat sink which extends substantially beyond, or is substantially wider than, said active region.

In addition, it has been found that the thermal resistance may be substantially reduced by forming a junction with a thin layer of material contacting a semiconductor body. The layer may be metal, semiconductor material of the kind as said body or of a different kind and/or any other desired material which will form a junction with said body and to which a good thermal bond may be made. A heat sink is formed by plating a material having a higher thermal conductivity than said layer onto said thin layer. Since some metals such as gold which will act as good heat conductors may at elevated temperatures diffuse into the semiconductor body, the thin layer of material used to form the junction may also be used as a diffusion barrier. For example, if the semiconductor body is N type gallium arsenide doped, for example, with tellurium, the diffusion barrier layer may be platinum.

This invention further discloses that the device may be formed by epitaxially growing a layer of semiconductor material on a semiconductor substrate, forming a barrier junction, plating a heat sink of sufficient thickness to provide a low thermal resistance heat dissipation path onto the barrier layer, and removing the semiconductor material on the opposite side of the junction to reduce the thickness of the semiconductor body so that the major portion of said body will be utilized as an active or avalanching region. The opposite surface of the semiconductor body from that used to form the barrier junction is then coated with metal and selected portions of said metal and the underlying semiconductor body adjacent to the active region are then removed by etching. This metal layer may be an evaporated layer of gold over an evaporated layer of platinum, which will form a barrier junction with the gallium arsenide if the entire gallium arsenide body is N doped. However, since this junction is normally forward biased and hence has a low resistance during operation of the system.

This invention also discloses that the resistance through the gallium arsenide body, which reduced gain and efficiency, can be reduced by the use of a heavily doped or N+ region on the opposite side of the avalanche region of the semiconductor body from that adjacent to the plated heat sink. Since the N+ region is low resistance, its thickness is less critical than the thickness of the N−, or avalanche, region. Accordingly this invention discloses that the thickness of the N− layer may be closely controlled by epitaxially growing the N− layer on a substrate of N+ material. The N− layer has a thickness and carrier density sufficient to avalanche when a reverse bias voltage is applied across the junction formed with said N− region without the depletion regions extending into, or punching through to, the N+ region.

A DC potential is maintained between the metal layers on the opposite sides of the semiconductor material whose polarity back biases the junction adjacent the heat sink and causes space charge to extend from the back bias junction into the semiconductor body. The potential is preferably supplied from a constant current source such that the voltage back bias on the junction will increase until avalanching and amplification occur. The avalanche region may amplify an input signal from an external microwave source if the device is used as an external signal amplifier or as an oscillator.

Since such devices have a relatively low impedance at microwave frequencies, it is desirable that the opposing metal layers, which may be regarded as a parallel plate capacitance, be kept to the minimum necessary for maintenance of the DC field within the semiconductor body be removing the unused regions of semiconductor material.

BRIEF DESCRIPTION OF THE DRAWINGS

Other and further objects and advantages of the invention will become apparent as the description thereof progresses, reference being had to the accompanying drawings wherein.

DESCRIPTION OF THE PREFERRED EMBODIMENT

Figure 1:
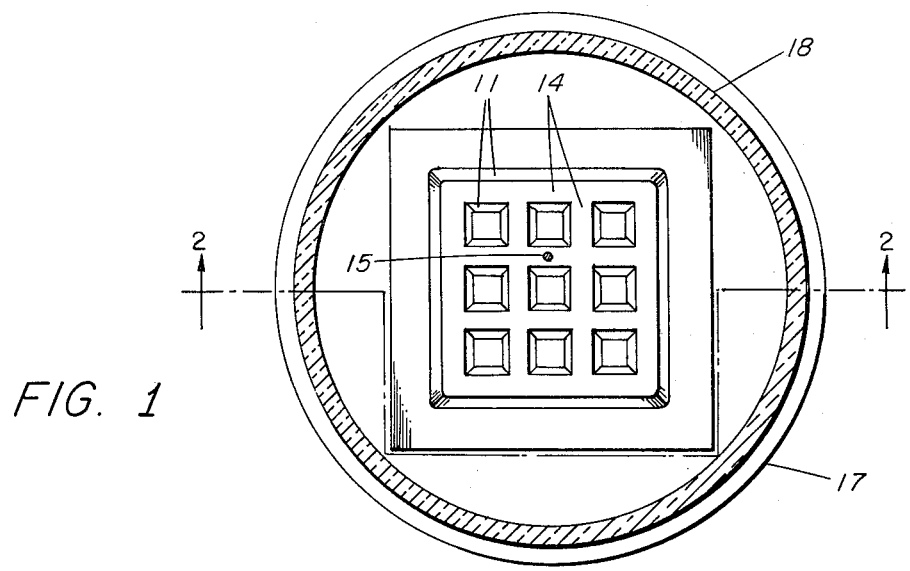
FIG. 1 illustrates a cross-sectional view of an embodiment of the invention illustrated in FIG. 2 taken along line 11 of FIG. 2.
Figure 2:
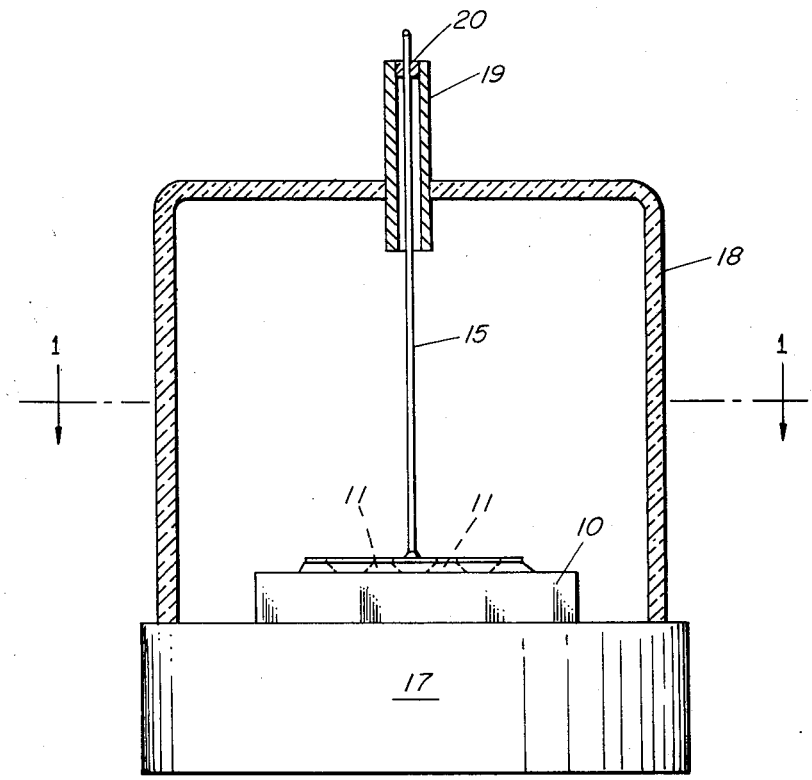
FIG. 2 illustrates a transverse partial-sectional view of the device illustrated in FIG. 1 taken along line 2—2 of FIG. 1.
Figure 3:
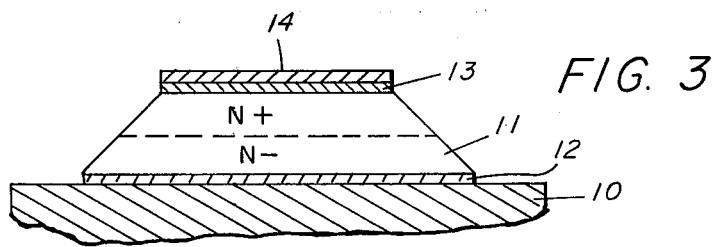
FIG. 3 illustrates an expanded view of one of the junction regions shown in FIG. 2.

Referring now to FIGS. 1 through 3, there is shown a flat slab 10 which may be, for example, of any good thermal conductive material such as gold. For a device having a few watts of output, slab 10 may be, for example, 7 to 10 mils thick and be, for example, in the form of a square 65 mils on a side. Supported by slab 10 is a semiconductor body 11 which may be of any desired material, such as gallium arsenide, silicon or indium phosphide. As indicated herein, semiconductor body 11 has a thickness of around 10 microns and a smallest traverse dimension along the heat sink slab 10, or width at the heat sink of approximately 50 microns. Positioned between semiconductor body 11 and the heat sink 10 is a thin layer of metal 12 which forms a Schottky barrier junction with the semiconductor body 11. Many materials may be used for the layer 12, the specific material, disclosed herein by way of example only, being platinum approximately 0.4 microns thick.

The region of the semiconductor body 11 adjacent the heat sink 12 is an N— region having a high resistivity of, for example, $10^{14}$ to $5 \times 10^{17}$ carriers per cubic centimeter produced by doping the semiconductor body with an N type impurity. This region may be, for example, 5 to 10 microns thick depending on the carrier concentration and is preferably made thick enough that avalanching will occur in this region without the space charge produced by a back bias potential across the junction extending outside of the N— region. On the opposite side of the N— region from platinum layer 12 is an N+ region with a carrier concentration on the order of $10^{18}$ carriers per cubic centimeter or greater.

The N+ region has a layer 13 of platinum thereon, for example, 0.3 microns thick, which forms a junction with the N+ region. However, this junction will normally be low resistance since it is forward biased during operation. Formed on layer 13 is a layer 14 which may be, for example, of gold having a thickness, for example, of 0.6 microns. The platinum layers 12 and 13 prevent diffusion of the gold from slab 10 or layer 14 into the gallium arsenide body 11.

The body 11, is shown herein by way of example only, as a configuration of two series of four elongated regions intersecting each other in mutually orthogonal directions, each region having a width of approximately 2 mils or 50 microns and a length of approximately 50 mils so that only a few percent of the total surface area of the slab 10 is covered by the semiconductor material. Due to the elongated configuration, a substantial portion of the heat which would otherwise flow substantially entirely in a direction normal to the surface of the slab 10, will flow in directions having components parallel to the slab 10, thereby increasing the total heat flow for a given temperature gradient between body 11 and slab 10. This may, if desired, be regarded as reducing the thermal resistance between the source of heat in the N— region of the semiconductor body and the slab 10 through which heat is extracted from the device either by radiation to the air or by contact with a solid heat sink or a fluid.

Slab 10 is mounted on a package base 17 which is preferably of metal and to which is sealed an envelope 18 which may be of glass or ceramic. Extending through envelope 18 is a tubular metal member 19 through which a lead-in conductor 15 conducts input power to the layer 14. The package is closed by sealing conductor 15 to member 19 by a solder seal 20 at the outer end of member 19. This package is illustrated by way of example only, and any desired conventional packaging arrangement could be used.

METHOD OF FORMING THE PREFERRED EMBODIMENT

A wafer of gallium arsenide a few mils thick is sliced from a grown crystal of gallium arsenide doped with sulphur Underwriters' Underwriter'to a carrier concentration on the order of $10^{18}$ carriers per cubic centimeter, hereinafter referred to as N+ material. A layer of gallium arsenide doped with tellurium to a carrier concentration in the range of $10^{14}$ to $5 \times 10^{17}$ carriers per cubic centimeter, is epitaxially grown on one surface of the N+ slice by any desired epitaxial processes to form an N— layer having a substantially higher resistance layer than the N+ layer and a thickness of 5 to 10 microns. The thickness and carrier concentration of the N— layer is selected in accordance with well-known practice for the desired operating voltage and frequency range of the device as a microwave amplifier or oscillator. In general, the lower the number of carriers, the higher the frequency range, and the N— region must be thick enough for sufficient back bias to be applied across the junction formed with the N— layer to produce avalanching without the depletion layer extending into the N+ layer.

The N— surface is then coated with a layer of platinum by exposure to a heated source of platinum in a vacuum, in accordance with well-known practice, to produce vapor deposition of the platinum on the surface of the N— layer. The thickness of the platinum layer is controlled by the length of time of exposure to the heated platinum source and preferably is around 0.4 microns thick. Thinner layers may have pinholes in the layer, whereas thicker layers result in an increase in thermal resistance through the layer.

The platinum surface then has the heat sink 10 plated thereon by immersing the wafer in any desired conventional gold plating solution and applying an appropriate voltage between the platinum layer 12 and an electrode immersed in the solution, in accordance with well-known practice. Heat sink 10 may be of any desired thickness and is shown by way of example as 7 to 10 mils thick. As used through the specification and the claims, the term "heat sink" is meant to include the solid regions of material having a higer thermal conductivity than the semiconductor region and through which heat, generated during operation of the device, is conducted away from the semiconductor region.

A portion of the wafer on the opposite side of the heat sink 10 is removed by lapping or etching, for example with a solution of $H_2SO_4$, $H_2O_2$ and $H_2O$ to thin the wafer, since the original wafer is sufficiently thick to avoid breaking the wafer during the initial processing described above while the finished thickness of the N+ region of the wafer is made as thin as practicable to reduce its resistance and thereby improve the efficiency and gain of the device. In the embodiment illustrated herein, the thickness of the semiconductor body 11 is not substantially greater than 10 microns, but the use of other materials or carrier concentrations could result in greater or lesser optimum thickness of the body 11.

The N+ surface of the wafer is then coated with a layer of platinum in a similar manner to the formation of layer 12. The thickness of the platinum layer 13 may be somewhat thinner than the layer 12 since its junction characteristics are of substantially less importance although it is desirable that there be no pinholes in the layer, and preferably layer 13 is on the order of 0.3 microns thick. A layer of gold approximately 0.5 microns thick is deposited over the platinum layer 13 by a similar vacuum deposition process to that used to form layers 12 and 13. The gold layer 14, as well as the heat sink 10, provides good electrical distribution of the input DC supply voltage across the semiconductor body during operation of the device.

A mask is formed on the top of layer 14 by conventional photoresist techniques, to expose the areas where the body 11 and the layers 12, 13 and 14 are to be removed. These layers are then removed by subjecting the wafer successively to appropriate etchants which etch the materials in accordance with well-known practice. The mask is then removed and the wafer diced to form a number of individual structures like that shown in FIG. 1.

An electrical contact is made to one region of the layer 14, for example as shown by the wire 15. The heat sink 10 is attached to a base 17 which is preferably of metal and to which is bonded an envelope 18 of glass or ceramic through which lead 15 is connected by a metal lead-in member 19. Lead-in member 19 may be, for example, a hollow tube with wire 15 fed through the tube and attached to the outer end thereof, for example by a solder seal 20.

DESCRIPTION OF SYSTEMS EMBODYING THE INVENTION

Figure 4:
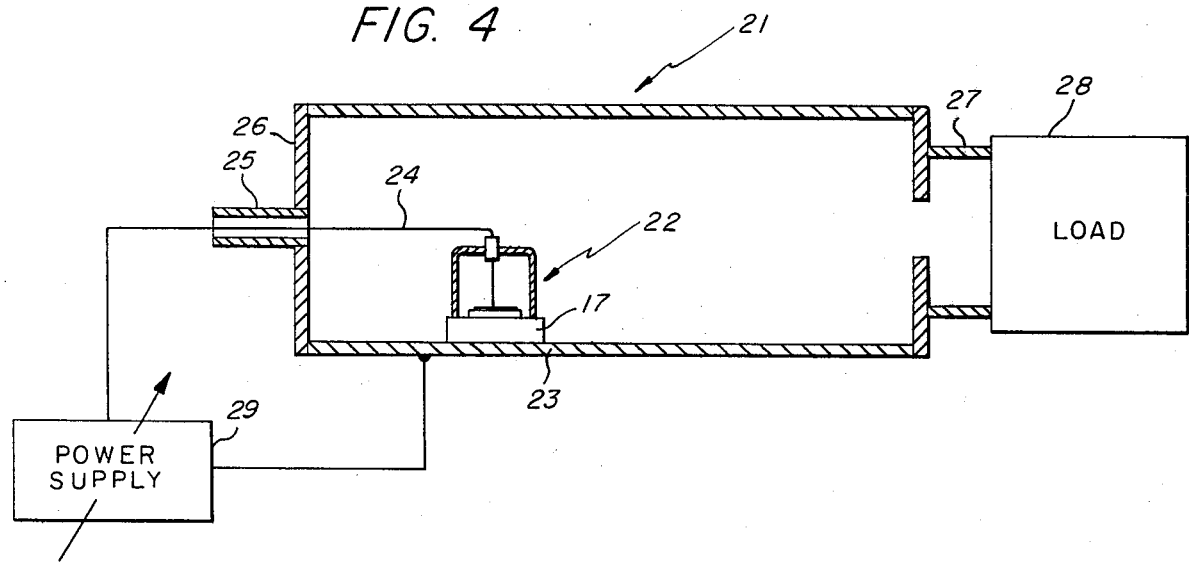
FIG. 4 illustrates an embodiment of the invention showing the device of FIG. 1, 2 and 3 operated as an oscillator coupled to a load.

Referring now to FIG. 4, there is shown a system in which the device of FIGS. 1 through 3 is used. Waveguide 21 has positioned therein device 22 which may be of the type illustrated in FIGS. 1, 2 and 3. The base 17 of the device 22 is attached to the lower wall 23 of the waveguide, and the lead-in member 19 is connected to a conductor 24 which extends through a microwave choke 25 in an end plate 26 of waveguide 21 to provide a path for the application of input power from a DC power source 26. Source 26 is preferably of the adjustable constant current type and adjust the operating power level of the device. Supply 26, may, if desired, be a pulsed or intermittent current supply to produce pulsed microwave energy output from the device.

The other end of the waveguide 21 has a microwave coupling structure, such as, for example, an iris 27 which couples the waveguide 21 to a load 28. Load 28 may be, for example, an antenna structure or the interior of a cavity to be supplied with microwave energy to heat a body positioned therein.

The spacing of the device 22 from the end plate 26 is determined by the relative impedances of the microwave source 22 and the load 28 to which device 22 is coupled. The device 22 has an impedance on the order of 10 ohms which is lower than most types of loads 28. Accordingly, device 22 is spaced substantially less than a quarter wavelength, at the operating frequency of the system, from the end plate 26, whereas the load 28, which will normally have a higher impedance than device 22, is spaced a greater distance than the device 22, but preferably less than a quarter wavelength, from the end plate 26. It is contemplated that any desired impedance matching structure such as broad band impedance matching structure can be substituted for the impedance matching structure illustrated herein.

Figure 5:
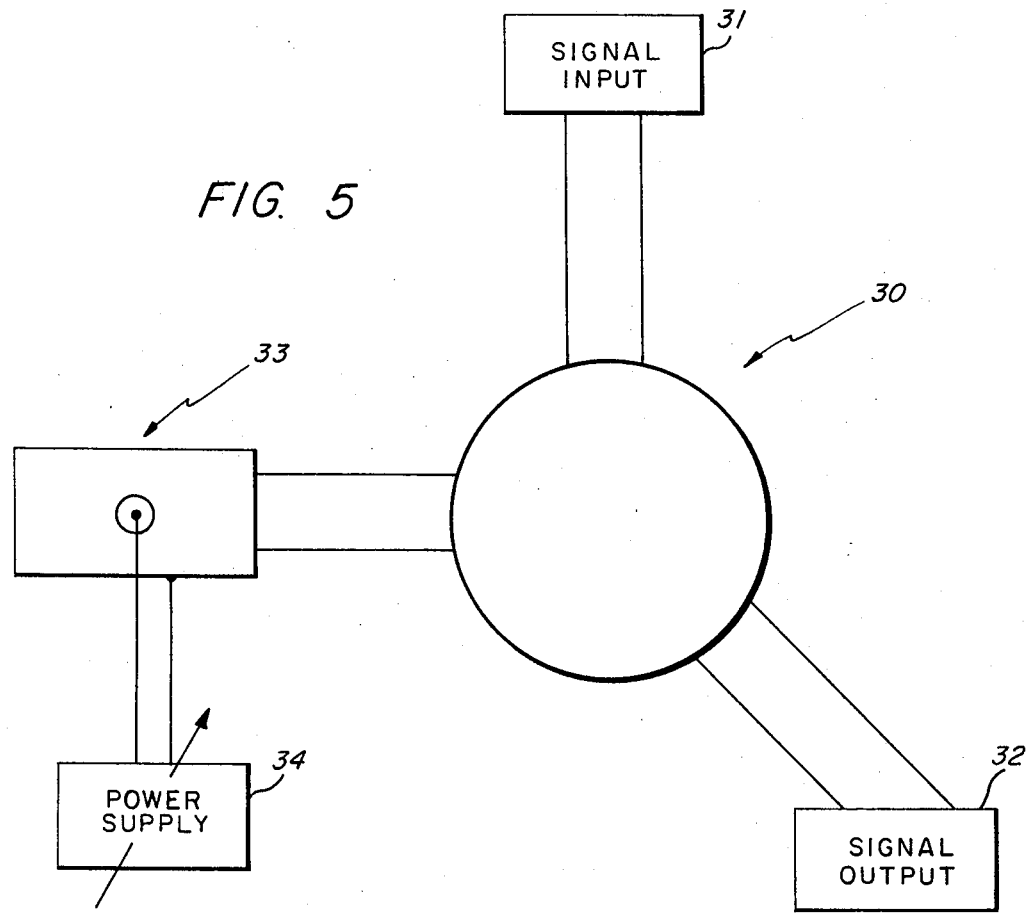
FIG. 5 illustrates an embodiment of the invention in a system for amplifying an external microwave signal.

Referring now to FIG. 5, there is shown an amplifier embodying the invention in which a conventional three-port circulator at 30 has a signal input 31 coupled to a first terminal, a signal load 32 is coupled to a second terminal and a device 33 of the type described in FIGS. 1 through 3 coupled through any desired impedance matching structure to a third terminal. A signal from the signal input terminal 31 is coupled to the terminal 33, amplified by the semiconductor device and coupled to the output signal load 32, whereas any small reflections of signals from the load 32, due for example to misadjustment of the impedance match of load 32 to the circulator 30, are coupled back to the impedance matched signal input 30 and absorbed thereby. Current is supplied to the device 33 by a variable current power supply 34, and preferably the current is adjusted to a level just below that at which oscillations would occur, in the absence of an input signal, in order to achieve maximum amplification of input signals.

This completes the description of the embodiments of the invention illustrated herein. However, many modifications thereof will be apparent to persons skilled in the art without departing from the spirit and scope of this invention. For example the same heat sink can be used for Gunn type amplifiers or oscillators. Accordingly, it is intended that this invention not be limited to the particular details of the embodiments illustrated herein except as defined by the appended claims.

What is claimed is:
1. In combination:
 a body of semiconductor material having a plurality of elongated regions for producing charge carrier multiplication, each of said elongated regions orthogonally intersecting other ones of said elongated regions;
 a first layer of metal contacting said semiconductor material at a boundary of said regions and forming a unidirectionally conductive junction therewith:
 the thickness of said first metal layer being substantially less than the thickness of said regions;
 the width of said regions and said unidirectionally conductive junction extending in a direction substantially transverse to the average direction of motion of said carriers for a distance less than 10 times the thickness of said regions;

means for producing charge carrier multiplication in said regions comprising means for applying a voltage in a reverse direction across said junction and across said regions;

a heat sink of material having a greater specific thermal conductivity than the specific thermal conductivity of said first metal layer thermally coupled to said regions substantially directly through said first metal layer;

said heat sink being substantially thicker than said first metal layer and extending in substantially all directions substantially transverse to the direction of motion of said carriers for substantial distances beyond the edges of said regions; and a second layer of metal coupled to said body of semiconductor material upon each of said regions on the side of said semiconductor body opposite said first layer of metal, said conductive metallic layer of interconnecting said regions.

2. The combination in accordance with claim 1 wherein:

said heat sink comprises electrically conductive material bonded to said metal layer which forms said junction with said semiconductor material.

3. The combination in accordance with claim 2 wherein:

said semiconductor material is gallium arsenide and said heat sink is metal.

4. In combination:

a body of semiconductor material comprising gallium arsenide;

said body having a plurality of elongated regions for producing charge carrier multiplication, each of said elongated regions orthogonally intersecting other ones of said elongated regions;

a first layer of metal having a thickness substantially less than the thickness of said regions deposited on said body and forming a substantially unidirectionally conductive junction with said regions;

a heat sink comprising material having a substantially higher thermal conductivity than the metal of said layer and said semiconductor body formed on said metal layer and thermally coupled to said regions through said metal layer;

the portion of said heat sink formed on said metal layer extending in a direction substantially transverse to the average direction of motion of said charge carriers in said regions for a distance substantially beyond the edges of said regions;

means for producing charge carrier multiplication in said regions comprising means producing a voltage extending across said regions and in a reverse polarity across said junction comprising a second metal layer contacting said body on the opposite side of said regions from said junction; and means for coupling microwave energy out of said regions.

5. The combination in accordance with claim 4 wherein:

said first metal layer comprises platinum.

6. The combination in accordance with claim 5 wherein:

said carrier multiplication region has a carrier concentration in the range of $10^{14}$ to $5 \times 10^{17}$ carriers per cubic centimeter.

7. The combination in accordance with claim 4 wherein:

said heat sink comprises gold.

* * * * *

UNITED STATES PATENT OFFICE
CERTIFICATE OF CORRECTION

Patent No. 3,986,142      Dated October 12, 1976

Inventor(s) Chung Kyu Kim

It is certified that error appears in the above-identified patent and that said Letters Patent are hereby corrected as shown below:

Column 1, line 35, change "wich" to - which -;

Column 2, line 37, change "reduced" to - reduces -;

Column 3, line 1, change "be" to - by - ;

Column 4, line 31, delete "Underwriters' Underwriter'-;

Column 6, line 61, after therewith change ":" to - ; -.

Signed and Sealed this

First Day of February 1977

[SEAL]

*Attest:*

RUTH C. MASON
*Attesting Officer*

C. MARSHALL DANN
*Commissioner of Patents and Trademarks*

UNITED STATES PATENT AND TRADEMARK OFFICE
CERTIFICATE OF CORRECTION

PATENT NO. : 3,986,142
DATED : October 12, 1976
INVENTOR(S) : Chung Kyu Kim

It is certified that error appears in the above—identified patent and that said Letters Patent is hereby corrected as shown below:

The term of this patent subsequent to June 22, 1993 has been disclaimed.

*Signed and Sealed this*

*Twenty-third* Day of *September 1980*

[SEAL]

*Attest:*

*Attesting Officer*

SIDNEY A. DIAMOND

*Commissioner of Patents and Trademarks*